United States Patent
Cho et al.

(10) Patent No.: US 7,948,418 B2
(45) Date of Patent: May 24, 2011

(54) DIGITAL-TO-ANALOG CONVERSION CIRCUIT AND COLUMN DRIVER INCLUDING THE SAME

(75) Inventors: Gyu Hyeong Cho, Gongju-si (KR); Yoon Kyung Choi, Yongin-si (KR); Hyoung Rae Kim, Hwasung-si (KR); Yong Joon Jeon, Daejeon (KR); Hyung Min Lee, Daegu (KR); Sung Woo Lee, Masan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/630,978

(22) Filed: Dec. 4, 2009

(65) Prior Publication Data

US 2010/0141493 A1 Jun. 10, 2010

(30) Foreign Application Priority Data

Dec. 5, 2008 (KR) .................. 10-2008-0123253

(51) Int. Cl.
*H03M 1/66* (2006.01)
(52) U.S. Cl. .................. 341/145; 345/89
(58) Field of Classification Search .............. 345/100, 345/89, 531; 341/145, 144
See application file for complete search history.

(56) References Cited

U.S. PATENT DOCUMENTS

| | | | |
|---|---|---|---|
| 5,572,211 A * | 11/1996 | Erhart et al. | 341/144 |
| 6,950,045 B2 * | 9/2005 | Kim | 341/118 |
| 2006/0202929 A1 * | 9/2006 | Baum et al. | 345/89 |
| 2006/0244710 A1 * | 11/2006 | Iriguchi et al. | 345/100 |
| 2007/0176811 A1 * | 8/2007 | Hsu et al. | 341/144 |
| 2007/0176813 A1 | 8/2007 | Nakayama et al. | |
| 2007/0273566 A1 | 11/2007 | Abe et al. | |
| 2008/0303836 A1 * | 12/2008 | Ludden et al. | 345/531 |

FOREIGN PATENT DOCUMENTS

| | | |
|---|---|---|
| JP | 2008-160782 | 7/2008 |
| KR | 1020060131341 | 12/2006 |
| KR | 1020070004001 | 1/2007 |

* cited by examiner

*Primary Examiner* — Jean B Jeanglaude
(74) *Attorney, Agent, or Firm* — F. Chau & Associates, LLC

(57) ABSTRACT

A digital-to-analog conversion circuit includes a digital-to-analog converter and a buffer amplifier. The digital-to-analog converter receives upper bits of digital data and a plurality of analog voltages and is configured to output two adjacent analog voltages of the plurality of analog voltages based on the upper bits. The buffer amplifier includes two input terminals. One of the input terminals receives one of the two adjacent analog voltages and the other input terminal receives the other adjacent analog voltage. The buffer amplifier is configured to generate a current offset by controlling a current flowing into each of the two input terminals based on lower bits of the digital bits.

20 Claims, 6 Drawing Sheets

FIG. 4

| Lower 5-bit Data | | | | | Current DAC | | Buffer Amp |
| --- | --- | --- | --- | --- | --- | --- | --- |
| $D_4$ | $D_3$ | $D_2$ | $D_1$ | $D_0$ | $I_1$ | $I_2$ | $V_0$ |
| 0 | 0 | 0 | 0 | 0 | 0 | $(32/32)\cdot I_0$ | $(0\cdot V_H+32\cdot V_L)/32$ |
| 0 | 0 | 0 | 0 | 1 | $(1/32)\cdot I_0$ | $(31/32)\cdot I_0$ | $(1\cdot V_H+31\cdot V_L)/32$ |
| 0 | 0 | 0 | 1 | 0 | $(2/32)\cdot I_0$ | $(30/32)\cdot I_0$ | $(2\cdot V_H+30\cdot V_L)/32$ |
| 0 | 0 | 0 | 1 | 1 | $(3/32)\cdot I_0$ | $(29/32)\cdot I_0$ | $(3\cdot V_H+29\cdot V_L)/32$ |
| 0 | 0 | 1 | 0 | 0 | $(4/32)\cdot I_0$ | $(28/32)\cdot I_0$ | $(4\cdot V_H+28\cdot V_L)/32$ |
| ... | ... | ... | ... | ... | ... | ... | ... |
| 1 | 1 | 1 | 0 | 1 | $(29/32)\cdot I_0$ | $(3/32)\cdot I_0$ | $(29\cdot V_H+3\cdot V_L)/32$ |
| 1 | 1 | 1 | 1 | 0 | $(30/32)\cdot I_0$ | $(2/32)\cdot I_0$ | $(30\cdot V_H+2\cdot V_L)/32$ |
| 1 | 1 | 1 | 1 | 1 | $(31/32)\cdot I_0$ | $(1/32)\cdot I_0$ | $(31\cdot V_H+1\cdot V_L)/32$ |

DIGITAL-TO-ANALOG CONVERSION CIRCUIT AND COLUMN DRIVER INCLUDING THE SAME

CROSS-REFERENCE TO RELATED APPLICATIONS

This application claims priority to Korean Patent Application No. 10-2008-0123253, filed on Dec. 5, 2008, in the Korean Intellectual Property Office (KIPO), the disclosure of which is incorporated by reference herein.

BACKGROUND

1. Technical Field

Embodiments of the present invention relate to a signal conversion technique, and more particularly, to a digital-to-analog conversion circuit for controlling a bias current of an input terminal to minimize the area of a buffer amplifier, and to a column driver including the same.

2. Discussion of Related Art

The size of a digital-to-analog (DAC) conversion circuit of a flat panel display typically increases as the number of gray levels displayed by the flat panel display increases. The increase in size of the DAC circuit may cause an increase in the area of a column driver integrated circuit (IC). Further, increases in the resolution of a flat panel display for high definition (HD) images may also cause an increase in the area of the column driver IC.

An increase in the area of the column driver IC typically correlates with an increase in production cost of the flat panel display. Accordingly, it would be beneficial to develop techniques to minimize the area of the column driver IC. A buffer amplifier may be included within a column driver IC to perform the D2A conversion.

However, a conventional buffer amplifier grows in size as the number of grays it is required to process increases. For example, the number of transistors required at an input terminal of the buffer amplifier doubles whenever the number of gray levels is increased.

SUMMARY

An exemplary embodiment of the present invention includes a digital-to-analog conversion circuit having a digital-to-analog converter and a buffer amplifier. The digital-to-analog converter (DAC) receives upper bits of digital data of a plurality of analog voltages. The DAC is configured to output two adjacent analog voltages among the plurality of analog voltages based on the upper bits. The buffer amplifier includes two input terminals. One of the input terminals receives one of the two adjacent analog voltages and the other input terminal receives the other adjacent analog voltage. The buffer amplifier is configured to generate a current offset by controlling a current flowing into each of the two input terminals based on lower bits of the digital data.

The buffer amplifier may divide a range between the two adjacent analog voltages into as many voltages as a number based on the number of the lower bits and output one voltage among the many voltages resulting from the division as an output voltage based on the lower bits. The sum of currents respectively flowing in the two input terminals may be constant.

An exemplary embodiment of the present invention includes a column driver having a shift register, a sampling latch, a holding latch, a plurality of digital-to-analog converters (DACs), and a plurality of buffer amplifiers. The shift register is configured to generate a plurality of latch signals in response to a start pulse and a clock signal. The sampling latch is configured to receive red-green-blue (RGB) digital data and latch the received digital data in response to the latch signals received from the shift register. The holding latch is configured to receive the digital data output from the sampling latch circuit and output the digital data in response to a load signal. Each digital-to-analog converter is configured to output two adjacent and different analog voltages among a plurality of consecutive analog gamma reference voltages based on upper bits of the digital data. Each buffer amplifier is configured to receive the two adjacent analog voltages from a respective one of the DACs and configured to divide a range between the two adjacent analog voltages into as many analog voltages as a number based on the number of lower bits of the digital data and output one of the many analog voltages based on the lower bits. Each buffer amplifier includes two input terminals and a current digital-to-analog converter. One of the two input terminals receives a first one of the two adjacent analog voltages and the other input terminal receives the other adjacent analog voltage. The current digital-to-analog converter is configured to generate a current from a first current flowing into one of the two input terminals and a second current flowing into the other one of the two input terminals based on the lower bits. The current digital-to-analog converter includes a plurality of current dividers and a plurality of pairs of switching transistors. The current dividers are cascade connected to one another and number the number of bits of the lower bits. An output of each pair of the switching transistors is connected to a respective input of a corresponding one of the current dividers. An input of one transistor of each pair receives the first current and an input of the other transistor of each pair receives the second current. A corresponding one of the lower bits is applied to the gate terminals of a corresponding pair of the switching transistors. The lower bits are independent of the upper bits and the lower and upper bits number at least one bit.

The plurality of current dividers may consecutively divide a bias current having a constant magnitude by 2 and a current output from each of the current dividers may be added to one of the currents respectively flowing into the two input terminals based on a value of one of the lower bits.

The column driver may further include a connection controller including connections from an output of each buffer amplifier to each one of a plurality of channels and configured to output an output signal of a corresponding one of the buffer amplifiers to a respective one of the channels in response to an output control signal after the lapse of a single horizontal line period.

Each buffer amplifier may further include a summing circuit, where the first input terminal corresponds to a first transistor, the second input terminal corresponds to a second transistor, one of the two analog data voltages is applied to a gate of the first transistor, the other one of the two data voltages is applied to a gate of the second transistor, and an output of the first transistor and an output of the second transistor is sent to the summing circuit. Each buffer amplifier may further include a third transistor connected to the second transistor, a fourth transistor connected to the first transistor, where an output voltage of the summing circuit is applied to the gates of the third transistors, and an output of the third transistor and an output of the fourth transistor is sent to the summing circuit. The summing circuit may be configured to sum one of the outputs from the first and second transistors or the outputs from the third and fourth transistors to generate the output voltage.

An exemplary embodiment of the present invention includes a column driver having a digital-to-analog conversion circuit and a switching circuit. The digital-to-analog conversion circuit is configured to convert digital data into analog data corresponding to a gray level displayed at a pixel and output the analog data. The switching circuit is configured to transmit the analog data output from the digital-to-analog conversion circuit to the pixel. The digital-to-analog conversion circuit includes a digital-to-analog converter and a buffer amplifier. The digital-to-analog converter is configured to output two adjacent analog voltages among a plurality of analog voltages based on upper bits of the digital data. The buffer amplifier includes two input terminals. One of the two input terminals receives one of the two adjacent analog voltages and the other one of the two input terminal receives the other one of the two adjacent analog voltages. The buffer amplifier is configured to generate a current offset by controlling a current flowing into each of the two input terminals based on lower bits of the digital bits.

The buffer amplifier may divide a range between the two adjacent analog voltages into as many voltages as a number based on the number of the lower bits and output one voltage among the many voltages resulting from the division as an output voltage based on the lower bits.

The buffer amplifier may include a first current digital-to-analog converter receiving the lower bits and outputting a first pair of bias currents in response to a first control signal, a current steering circuit receiving the first pair of bias currents, and a second current digital-to-analog converter receiving a second pair of bias currents from the current steering circuit and the lower bits, and outputting a signal in response to a second control signal. The buffer amplifier may include logic to output one of the first control signal or the second control signal based on the size of digital data. The logic may output one of the first control signal or the second control signal based on the upper three bits of the digital data.

BRIEF DESCRIPTION OF THE DRAWINGS

The present invention will become more apparent by describing in detail exemplary embodiments thereof with reference to the attached drawings in which:

FIG. 4 is a table for explaining a relationship between the magnitude of a bias current, lower bit data, and the magnitude of an output voltage in a current DAC included in a buffer amplifier according to an exemplary embodiment of the present invention;

DETAILED DESCRIPTION OF EXEMPLARY EMBODIMENTS

Figure 1:
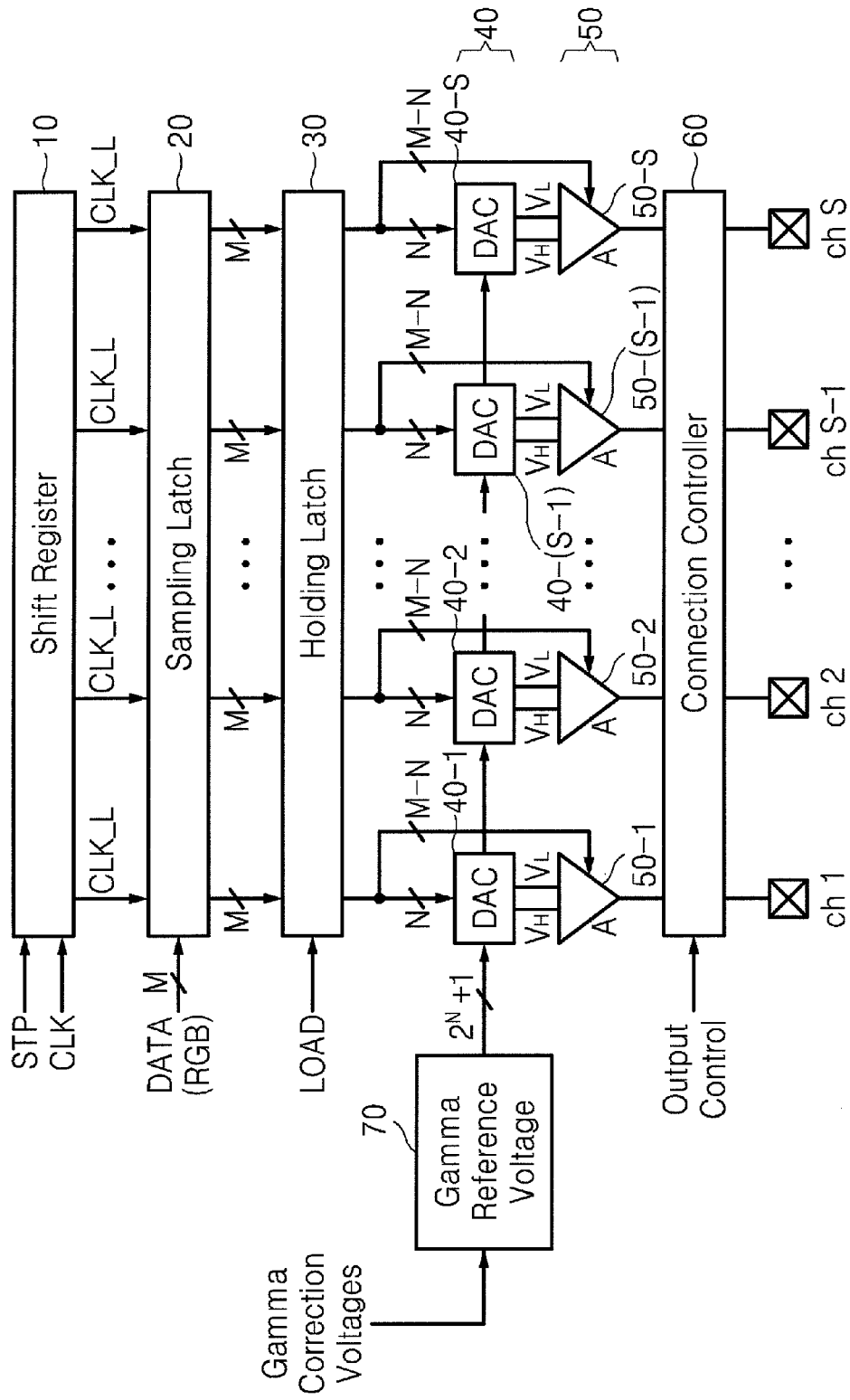
FIG. 1 is a schematic block diagram of a column driver according to an exemplary embodiment of the present invention.

The present invention now will be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of regions may be exaggerated for clarity. Like numbers refer to like elements throughout.

It will be understood that when an element is referred to as being "connected" or "coupled" to another element, it can be directly connected or coupled to the other element or intervening elements may be present.

A display panel may be driven by a display driver integrated circuit (IC). The display driver IC may include a column driver IC and a row driver IC. Rows of pixels included in the display panel may be sequentially selected by the row driver IC and a voltage or current corresponding to a gray level to be displayed at each pixel may be provided to the pixel by the column driver IC. Signals of the column driver IC and the row driver IC may be controlled by a timing controller.

FIG. 1 is a schematic block diagram of a column driver according to an exemplary embodiment of the present invention. The column driver includes a shift register 10, a sampling latch circuit 20, a holding latch circuit 30, a plurality of digital-to-analog converters (DACs) 40-1, 40-2, . . . , and 40-S, a plurality of buffer amplifiers 50-1, 50-2, . . . , and 50-S, and a connection controller 60. The column driver may further include a gamma reference voltage generator 70 generating a plurality of gamma reference voltages.

Referring to FIG. 1, in an exemplary embodiment of the present invention, the column driver and a display device including the same, M (e.g., a natural number)-bit data is provided to each pixel of the display device. N (e.g., a natural number less than M) bits of the M bits are subjected to digital-to-analog conversion by each DAC 40 of a plurality of the DACs 40-1 through 40-S and the remaining (M-N) bits are subjected to digital-to-analog conversion by each buffer amplifier 50 of a plurality of the buffer amplifiers 50-1 through 50-S using data output from the DAC 40. The DAC 40 converts digital data of the upper N bits or N most significant bits (MSBs) among the M-bit digital data into analog data and the buffer amplifier 50 converts digital data of the lower (M-N) bits or (M-N) least significant bits (LSBs) of the M-bit digital data into analog data.

The shift register 10 sequentially outputs a plurality of latch signals CLK_L to the sampling latch circuit 20 in response to a signal STP triggered at the beginning of a line time (e.g., a start pulse) and a clock signal CLK. The sampling latch circuit 20 receives RGB digital data DATA and latches the received data DATA in response to the latch signals CLK_L received from the shift register 10.

The holding latch circuit 30 receives data output from the sampling latch circuit 20 and outputs the data to channels ch1, ch2, . . . , and chS in response to an external control signal LOAD. Each DAC 40 converts the upper N-bit digital data of M-bit digital data corresponding to one of the channels ch1 through chS into analog data.

Each DAC 40 receives ($2^N$+1) analog voltages output from the gamma reference voltage generator 70 and outputs two gamma reference voltages $V_H$ and $V_L$ corresponding to the upper N-bit digital data among the ($2^N$+1) analog voltages. The gamma reference voltage generator 70 may generate the ($2^N$+1) analog voltages using a resistor string. The column driver may include a single resistor string. When the DAC 40 has a nonlinear characteristic, the gamma reference voltage generator 70 may receive gamma correction voltages to adjust output voltages to the nonlinear characteristic of the DAC 40. A single DAC 40 may be provided for each of the channels ch1 through chS.

Each buffer amplifier 50 receives the two gamma reference voltages $V_H$ and $V_L$ output from one DAC 40 among the DACs 40-1 through 40-S, divides a range between the gamma reference voltages $V_H$ and $V_L$ into $2^{(M-N)}$ intervals, and outputs one voltage between the gamma reference voltages $V_H$ and $V_L$ that corresponds to one of the $2^{(M-N)}$ intervals. For example, if $V_H$ is 32 v, $V_L$ is 0 v, M=10, and N=5, the range would be 32 (e.g., $V_H$ of 32 v–$V_L$ of 0 v=32), the number of intervals would be 32 (e.g., $2^{10-5}$=32), and one voltage between 32V and 0V that corresponds to one of the 32 intervals could be, 16 v, 20 v, etc.

An analog voltage output from the buffer amplifier 50-1, 50-2, . . . , or 50-S is transmitted to one of the channels ch1 through chS and is used to represent a gray level of an image. After the lapse of a single horizontal line period, the connection between each buffer amplifier 50 and one of the channels ch1 through chS is controlled by the connection controller 60 in response to an external control signal "Output Control".

The buffer amplifier, e.g., 50-1 of an odd column may provide a voltage or a current corresponding to a gray level to be represented to the first channel ch1. After a single horizontal line period, the buffer amplifier 50-1 may provide a voltage or a current corresponding to a gray level to be represented to the second channel ch2. For example, the connection controller 60 may control the connection between an output of the buffer amplifiers 50-1 through 50-S and the input of the channels ch1 through chS to be cross-connected. Alternatively, after the lapse of a single horizontal line period, equalization of the channels ch1 through chS may be performed by an equalizer (not shown).

As described above, each DAC 40 performs conversion on only the upper N bits in digital data and each buffer amplifier 50 performs conversion on the remaining bits in the digital data, thereby reducing the overall area of a digital-to-analog conversion circuit.

Figure 2:
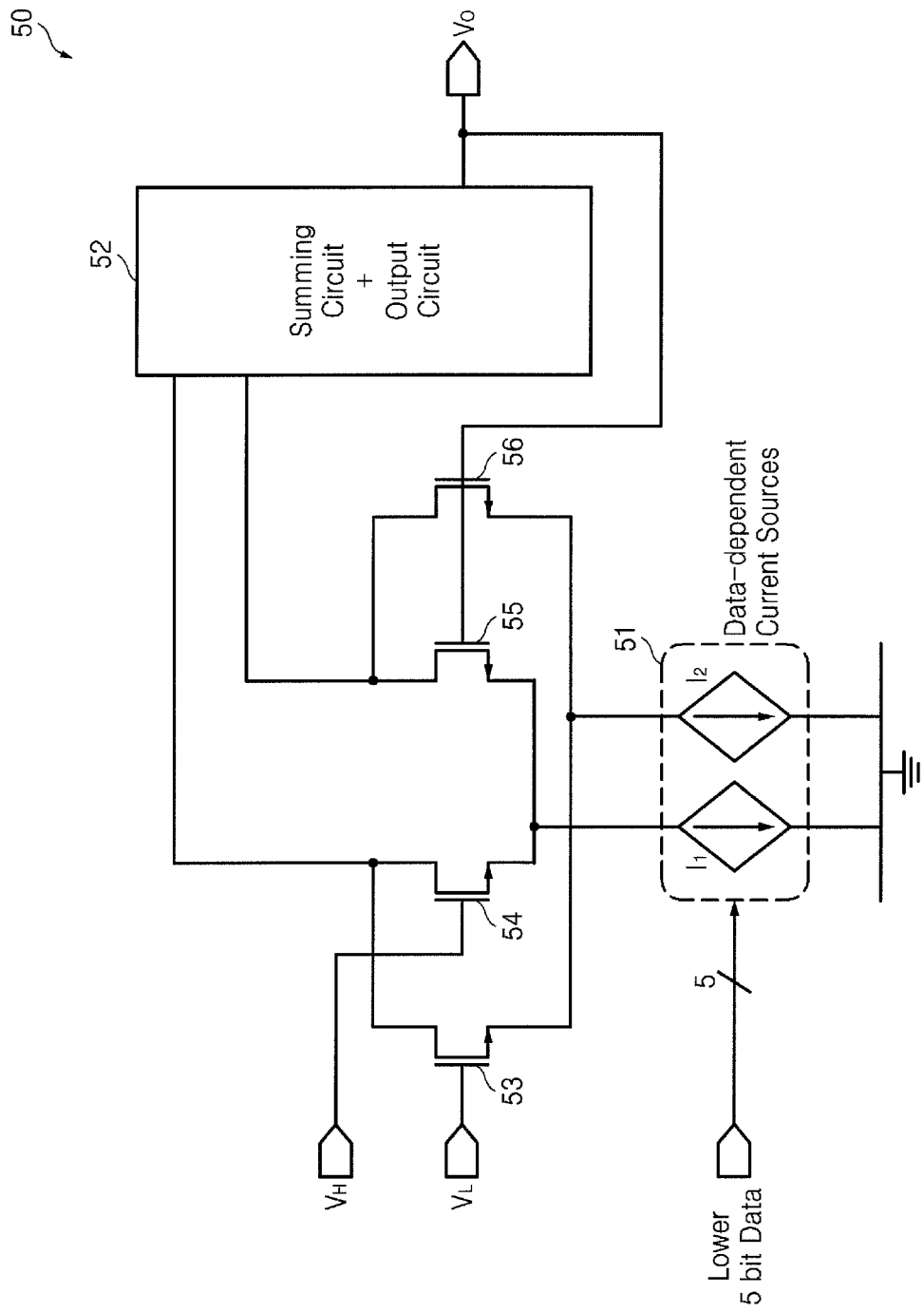
FIG. 2 is a schematic block diagram of a buffer amplifier according to an exemplary embodiment of the present invention.

FIG. 2 is a schematic block diagram of the buffer amplifier 50 according to an exemplary embodiment of the present invention. The buffer amplifier 50 exemplified in FIG. 2 may be a single-rail design. Referring to FIGS. 1 and 2, the buffer amplifier 50 includes first input terminals 54 and 55, second input terminals 53 and 56, and a current DAC 51 respectively supplying bias currents $I_1$ and $I_2$ to the first input terminals 54 and 55 and the second input terminals 53 and 56. The buffer amplifier 50 may further include a summing/output circuit 52 that sums output currents of the first input terminals 54 and 55 or output currents of the second input terminals 53 and 56 and outputs a summed result.

As illustrated in FIG. 2, the buffer amplifier 50 receives two gamma reference voltages $V_H$ and $V_L$ from the DAC 40. The first gamma reference voltage $V_H$ may be input to the first input terminals 54 and 55 as a positive (+) input of each of the first input terminals 54 and 55. The second gamma reference voltage $V_L$ may be input to the second input terminals 53 and 56 as a positive (+) input of each of the second input terminals 53 and 56.

The current DAC 51 generates variable bias currents $I_1$ and $I_2$ based on digital data of the lower (M-N) bits of M-bit digital data provided to the channels ch1, ch2, . . . , or chS and provides the bias currents $I_1$ and $I_2$ to the first input terminals 54 and 55 and the second input terminals 53 and 56. For example, the buffer amplifier 50 generates a current offset based on a current difference between the bias current $I_1$ supplied to the first input terminals 54 and 55 receiving the first gamma reference voltage $V_H$ and the bias current $I_2$ supplied to the second input terminals 53 and 56 receiving the second gamma reference voltage $V_L$. As a result, an output voltage $V_O$ of the buffer amplifier 50 is in between the first gamma reference voltage $V_H$ and the second gamma reference voltage $V_L$.

The current DAC 51 included in the buffer amplifier 50 supplies to the input terminals 54, 55, 53, and 56 the bias currents $I_1$ and $I_2$ varying with the lower (M-N)-bit digital data of the M-bit digital data, so that the buffer amplifier 50 outputs as the output voltage $V_O$ one voltage among voltages obtained by dividing a range between the first gamma reference voltage $V_H$ and the second gamma reference voltage $V_L$ into $2^{(M-N)}$ intervals. In an exemplary embodiment of the present invention, the sum of the bias currents $I_1$ and $I_2$ may be constant.

Figure 3:
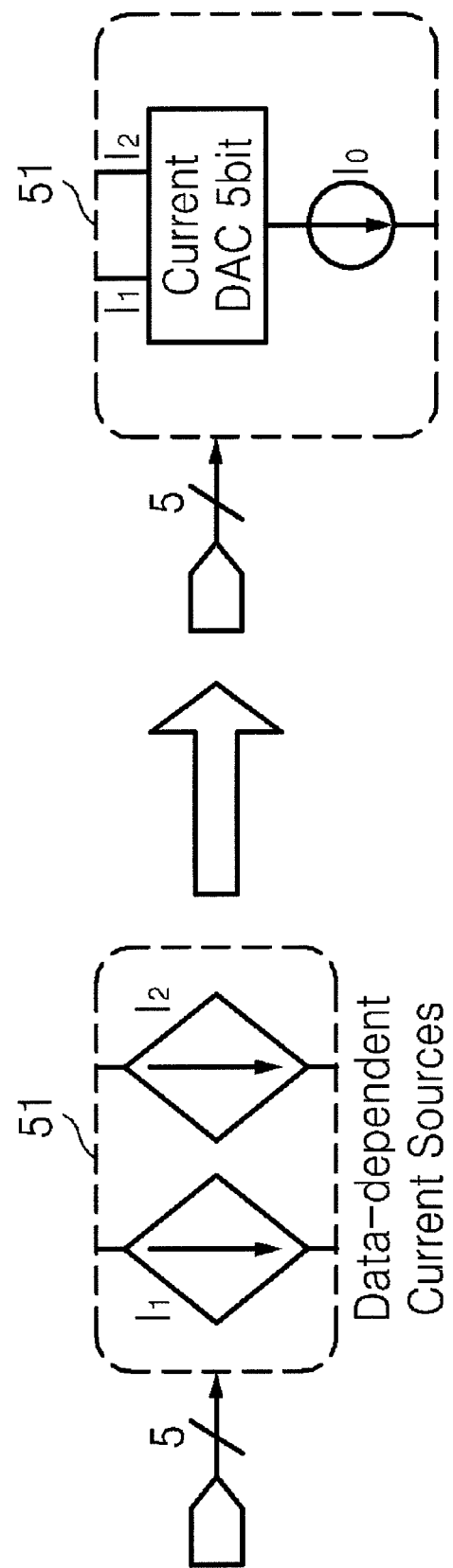
FIG. 3 is a conceptual diagram of a current digital-to-analog converter (DAC) included in a buffer amplifier according to an exemplary embodiment of the present invention.

FIG. 3 is a conceptual diagram of the current DAC 51 included in the buffer amplifier 50 according to an exemplary embodiment of the present invention. As described above, the current DAC 51 outputs the variable bias currents $I_1$ and $I_2$ based on digital data of lower (M-N) bits. The current DAC 51 outputting the variable bias currents $I_1$ and $I_2$ based on the lower (M-N)-bit digital data is illustrated on the left in FIG. 3. The current DAC 51 performing current-based digital-to-analog conversion to output the two bias currents $I_1$ and $I_2$, the sum $I_O$ of which is constant, based on the lower (M-N)-bit digital data is illustrated on the right in FIG. 3.

FIG. 4 is a table for explaining the relationship between the magnitudes of the bias currents $I_1$ and $I_2$, the lower bit data, and the magnitude of the output voltage $V_O$ of the buffer amplifier 50 according to an exemplary embodiment of the present invention.

Referring to FIGS. 1 through 4, the magnitudes of the bias currents $I_1$ and $I_2$ are determined based on the lower 5-bit data, and therefore, the magnitude of the output voltage $V_O$ is also determined.

The bias currents $I_1$ and $I_2$ may include the first bias current $I_1$ supplied to the first input terminals 54 and 55 of the buffer amplifier 50 and the second bias current $I_2$ supplied to the second input terminals 53 and 56 of the buffer amplifier 50. The sum of the first bias current $I_1$ and the second bias current $I_2$ may be constant and denoted by $I_O$. As illustrated in FIG. 4, a ratio of the first gamma reference voltage $V_H$ to the output voltage $V_O$ of the buffer amplifier 50 may be determined based on the magnitude of the first bias current $I_1$ and a ratio of the second gamma reference voltage $V_L$ to the output voltage $V_O$ of the buffer amplifier 50 may be determined based on the magnitude of the second bias current $I_2$. The ratio of each gamma reference voltage $V_H$ or $V_L$ to the output voltage $V_O$ may be determined to be linearly proportional to the magnitude of the bias current $I_1$ or $I_2$ input to each input terminal.

For example, when the lower 5-bit data is "00000", as is illustrated in FIG. 4, the first bias current $I_1$ and the second bias current $I_2$ are supplied at a ratio of 0:1, so that the output voltage $V_O$ of the buffer amplifier 50 is equal to the second gamma reference voltage $V_L$. When the lower 5-bit data is "00001", the first bias current $I_1$ and the second bias current $I_2$ are supplied at a ratio of 1:31, so that the output voltage $V_O$ of the buffer amplifier 50 is "1/32*$V_H$+31/32*$V_L$".

The buffer amplifier 50 may be implemented such that the magnitude of the first bias current $I_1$ supplied to the first input terminals 54 and 55 receiving the first gamma reference voltage $V_H$ increases as the value of the lower 5-bit data increases. Accordingly, when the lower 5-bit data is "11111", the first bias current $I_1$ and the second bias current $I_2$ may be supplied at a ratio of 31:1. The output voltage $V_O$ of the buffer amplifier 50 may be one among the voltages obtained by dividing the range between the first gamma reference voltage $V_H$ and the second gamma reference voltage $V_L$ into $2^5$ (=32) intervals.

Figure 5:
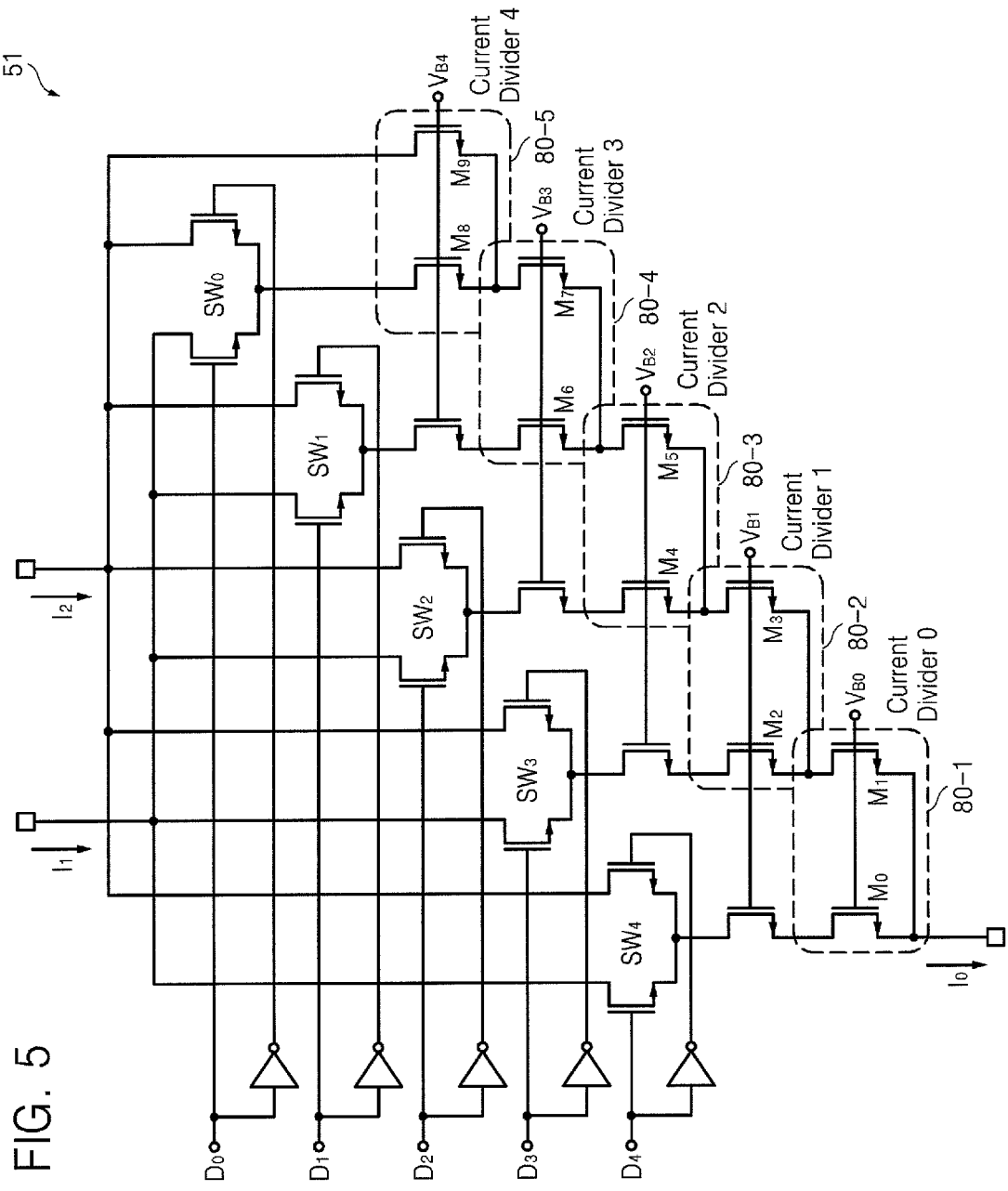
FIG. 5 is a circuit diagram of a current DAC included in a buffer amplifier according to an exemplary embodiment of the present invention.

FIG. 5 is a circuit diagram of the current DAC 51 included in the buffer amplifier 50 according to an exemplary embodiment of the present invention. Referring to FIGS. 1 through 5, the current DAC 51 may be a cascaded type. The current DAC 51 includes a plurality of current dividers 80-1, 80-2, 80-3, 80-4, and 80-5, which may each include a respective pair of transistors (e.g., $M_0$ and $M_1$, $M_2$ and $M_3$, $M_4$ and $M_5$, $M_6$ and $M_7$, and $M_8$ and $M_9$). Since the current DAC 51 illustrated in FIG. 5 varies the bias currents $I_1$ and $I_2$ based on lower 5-bit data, the current DAC 51 includes five current dividers 80-1 through 80-5. However, the present invention is not limited to 5-bits of lower data and a corresponding number of current dividers. For example, other embodiments of the present invention may use lower data of a lesser or greater size and a corresponding lesser or greater amount of current dividers.

The fixed bias current $I_O$ having a constant magnitude may be consecutively divided by 2 by the current dividers 80-1 through 80-5 and each divided current may be added to another divided current in a direction of the first bias current $I_1$ or the second bias current $I_2$ based on lower 5-bit digital data $D_4 \sim D_0$. Accordingly, the sum $I_O$ of the first bias current $I_1$ and the second bias current $I_2$ is constant.

In the current DAC 51 illustrated in FIG. 5, transistors (e.g., switching transistor pairs $SW_0$, $SW_1$, $SW_2$, $SW_3$, and $SW_4$) other than the current dividers 80-1 through 80-5 rarely influence matching, and therefore, the buffer amplifier 50 can have a minimal size. The main parts determining the size of the buffer amplifier 50 are the current dividers 80-1 through 80-5, and the current DAC 51 requires only two more transistors as the number of bits to be converted increases by 1. As a result, an increase in the area of the buffer amplifier 50 as the number of bits increases is minimized.

Figure 6:
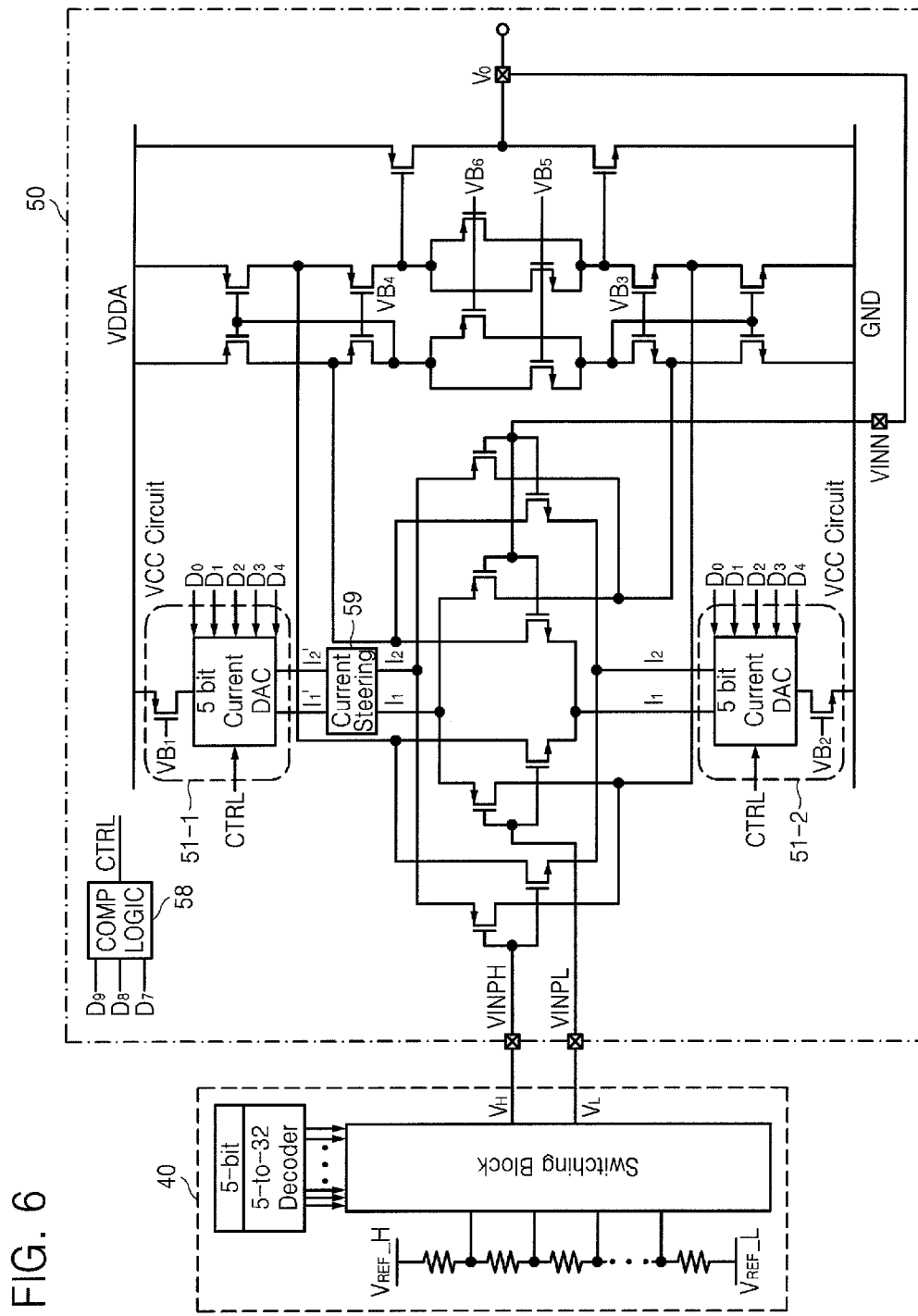
FIG. 6 is a block diagram of a digital-to-analog conversion circuit according to an exemplary embodiment of the present invention.

FIG. 6 is a block diagram of a digital-to-analog conversion circuit according to an exemplary embodiment of the present invention. In the embodiment illustrated in FIG. 6, the first gamma reference voltage $V_H$ and the second gamma reference voltage $V_L$ are generated based on upper 5-bit digital data of M-bit digital data and bias currents are supplied to input terminals based on lower 5-bit digital data of the M-bit digital data. However, the present invention is not limited to any particular number of upper and lower bits. For example, the 5-bit decoder and 5-bit Current DACs of FIG. 6 could be replaced with lower or higher bit versions (e.g., 4 bit, 6 bit, etc.) to accommodate different sized upper and lower bit data (e.g., 4 bit, 6 bit, etc.).

Referring to FIGS. 1 through 6, the digital-to-analog conversion circuit illustrated in FIG. 6 includes a buffer amplifier 50, which may be a rail-to-rail amplifier. The buffer amplifier 50 may include two current DACs 51-1 and 51-2 selectively driven according to the size of digital data. As illustrated in FIG. 6, when 10 bits of data are displayed, the buffer amplifier 50 may be implemented such that if the data has a size of 0 to 250, conversion is performed using the current DAC 51-1 driven by a P-type metal-oxide semiconductor (PMOS) transistor and if the data has a size of 251 to 1023, conversion is performed using the current DAC 51-2 driven by an N-type metal-oxide semiconductor (NMOS) transistor.

Accordingly, the buffer amplifier 50 may further include a comp-logic 58. The comp-logic 58 may output a control signal CTRL for selectively activating one of the current DACs 51-1 and 51-2 based on the size of digital data. For example, the control signal CTRL may be output based on the upper 3-bit data of the digital data, for example, $D_9$, $D_8$, and $D_7$ when the digital data is 10 bits in length. In an alternate embodiment, the control signal CTRL may be output based on a lesser number of bits (e.g., upper 2-bit $D_9$ and $D_8$, upper 1-bit $D_9$, etc.). Each of the current DACs 51-1 and 51-2 may be selectively activated in response to the control signal CTRL.

When the current DAC 51-1 driven by a PMOS transistor is activated in response to the control signal CTRL, the buffer amplifier 50 may further include a current steering circuit 59 to improve the linearity of bias currents $I_1'$ and $I_2'$ output from the current DAC 51-1. The bias currents $I_1'$ and $I_2'$ output from the current DAC 51-1 driven by a PMOS transistor may have poor linearity. The current steering circuit 59 reduces errors in the bias currents $I_1'$ and $I_2'$, thereby outputting bias currents $I_1$ and $I_2$ with improved linearity.

As described above, according to at least one exemplary embodiment of the present invention, two gamma reference voltages $V_H$ and $V_L$ are respectively input to two input terminals of a buffer amplifier regardless of the number of bits in data and bias currents varying with lower data are respectively supplied to the input terminals, so that the area of the buffer amplifier can be reduced. In addition, since sources of input terminal transistors are separated from each other in a circuit for generating the variable bias currents, a more linear and accurate output voltage can be generated as compared to conventional gate voltage modulation. A digital-to-analog conversion circuit according to at least one exemplary embodiment of the present invention performs digital-to-analog conversion based on a bias current that varies with lower bit data of input data, thereby minimizing the area of the buffer amplifier.

While the present invention has been particularly shown and described with reference to exemplary embodiments thereof, it will be understood by those of ordinary skill in the art that various changes in forms and details may be made therein without departing from the spirit and scope of the disclosure.

What is claimed is:

1. A digital-to-analog conversion circuit comprising:
a digital-to-analog converter receiving upper bits of digital data and a plurality of analog voltages and configured to output two adjacent analog voltages of the plurality of analog voltages based on the upper bits; and
a buffer amplifier comprising two input terminals,
wherein one of the input terminals receives one of the two adjacent analog voltages and the other input terminal receives the other adjacent analog voltage,
wherein the buffer amplifier is configured to generate a current offset by controlling a current flowing into each of the two input terminals based on lower bits of the digital bits.

2. The digital-to-analog conversion circuit of claim 1, wherein the buffer amplifier divides a range between the two adjacent analog voltages into as many voltages as a number based on the number of the lower bits, and output one voltage of the many voltages resulting from the division as an output voltage based on the lower bits.

3. The digital-to-analog conversion circuit of claim 1, wherein a sum of currents respectively flowing into the two input terminals is constant.

4. A column driver comprising:
a shift register configured to generate a plurality of latch signals in response to a start pulse and a clock signal;
a sampling latch configured to receive red-green-blue (RGB) digital data and latch the received digital data in response to the latch signals received from the shift register;
a holding latch configured to receive the digital data output from the sampling latch circuit and output the digital data in response to a load signal;

a plurality of digital-to-analog converters (DACs), each DAC configured to output two adjacent and different analog voltages from a plurality of consecutive analog gamma reference voltages based on upper bits of the digital data; and a plurality of buffer amplifiers, each buffer amplifier receiving the two adjacent analog voltages from a respective one of the DACs and configured to divide a range between the two adjacent analog voltages into as many analog voltages as a number based on the number of lower bits of the digital data and output one of the many analog voltages based on the lower bits, wherein each buffer amplifier comprises:
two input terminals, wherein one of the two input terminals receives a first one of the two adjacent analog voltages and the other input terminal receives the other adjacent analog voltage; and
a current digital-to-analog converter configured to generate a current from a first current flowing into one of the two input terminals and a second current flowing into the other one of the two input terminals based on the lower bits,
wherein the current digital-to-analog converter comprises:
a plurality of current dividers cascade connected to one another and numbering the number of bits of the lower bits; and
a plurality of pairs of switching transistors numbering the number of bits of the lower bits, an output of each pair connected to a respective input of a corresponding one of the current dividers, and an input of one transistor of each pair receiving the first current and an input of the other transistor of each pair receiving the second current,
wherein a corresponding one of the lower bits is applied to the gate terminals of a corresponding pair of the switching transistors, and
wherein the lower bits are independent of the upper bits and the lower and upper bits number at least one bit.

5. The column driver of claim 4, wherein the plurality of current dividers consecutively divide a bias current having a constant magnitude by 2 and a current output from each of the current dividers is added to one of the currents respectively flowing into the two input terminals based on a value of one of the lower bits.

6. The column driver of claim 4, further comprising a connection controller including connections from an output of each buffer amplifier to each one of a plurality of channels and configured to output an output signal of a corresponding one of the buffer amplifiers to a respective one of the channels in response to an output control signal after the lapse of a single horizontal line period.

7. The column driver of claim 4, further comprising a gamma reference voltage generator to generate the gamma reference voltages.

8. The column driver of claim 4, wherein the plurality of DACs and buffer amplifiers number five, the digital data is ten-bit data, the upper bits are the most significant upper five bits of the ten-bit data and the lower bits are the least significant lower five bits of the ten-bit data.

9. The column driver of claim 4, wherein each buffer amplifier further comprises:
a summing circuit, wherein first input terminal corresponds to a first transistor, the second input terminal corresponds to a second transistor, one of the two analog data voltages is applied to a gate of the first transistor, the other one of the two data voltages is applied to a gate of the second transistor, and an output of the first transistor and an output of the second transistor is sent to the summing circuit.

10. The column driver of claim 9, wherein each buffer amplifier further comprises a third transistor connected to the second transistor, fourth transistor connected to the first transistor, an output voltage of the summing circuit is applied to the gates of the third transistor, and an output of the third transistor and an output of the fourth transistor is sent to the summing circuit.

11. The column driver of claim 10, wherein the summing circuit is configured to sum one of the outputs from the first and second transistors or the outputs from the third and fourth transistors to generate the output voltage.

12. A column driver comprising:
a digital-to-analog conversion circuit configured to convert digital data into analog data corresponding to a gray level displayed at a pixel and output the analog data; and
a switching circuit configured to transmit the analog data output from the digital-to-analog conversion circuit to the pixel,
wherein the digital-to-analog conversion circuit comprises:
a digital-to-analog converter configured to output two adjacent analog voltages among a plurality of analog voltages based on upper bits of the digital data; and
a buffer amplifier comprising two input terminals, wherein one of the two input terminals receives one of the two adjacent analog voltages and the other one of the two input terminals receives the other one of the two adjacent analog voltages, wherein the buffer amplifier is configured to generate a current offset by controlling a current flowing into each of the two input terminals based on lower bits of the digital data.

13. The column driver of claim 12, wherein the buffer amplifier divides a range between the two adjacent analog voltages into as many voltages as a number based on the number of the lower bits and outputs one voltage among the many voltages resulting from the division as an output voltage based on the lower bits.

14. The column driver of claim 12, wherein the buffer amplifier comprises:
a first current digital-to-analog converter receiving the lower bits and outputting a first pair of bias currents in response to a first control signal;
a current steering circuit receiving the first pair of bias currents; and
a second current digital-to-analog converter receiving a second pair of bias currents from the current steering circuit and the lower bits, and outputting a signal in response to a second control signal.

15. The column driver of claim 14, wherein the buffer amplifier comprises logic to output one of the first control signal or the second control signal based on the size of digital data.

16. The column driver of claim 14, wherein the logic outputs one of the first control signal or the second control signal based on the upper three bits of the digital data.

17. The column driver of claim 14, wherein all of the digital-to-analog converters are five-bit.

18. The column driver of claim 17, wherein the digital data is 10-bit data, the upper bits are the most significant upper five bits of the ten-bit data and the lower bits are the least significant lower five bits of the ten-bit data.

19. The column driver of claim 12, further comprising:
a shift register configured to generate a latch signal in response to a start pulse and a clock signal;
a sampling latch configured to receive the data and latch the received digital data in response to the latch signal received from the shift register; and
a holding latch configured to receive the digital data output from the sampling latch circuit and output the digital data to digital-to-analog conversion circuit in response to a load signal.

20. The column driver of claim 12, further comprising a gamma reference voltage generator to generate the plurality of analog voltages.

* * * * *